United States Patent
Pereira et al.

(10) Patent No.: US 9,204,080 B2
(45) Date of Patent: Dec. 1, 2015

(54) MULTI-CHIP MODULES HAVING STACKED TELEVISION DEMODULATORS

(71) Applicant: Silicon Laboratories Inc., Austin, TX (US)

(72) Inventors: Vitor Pereira, Austin, TX (US); Ramin Khoini-Poorfard, Austin, TX (US); Eric Mauger, Liffre (FR)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/453,049

(22) Filed: Aug. 6, 2014

(65) Prior Publication Data

US 2015/0085195 A1    Mar. 26, 2015

Related U.S. Application Data

(60) Provisional application No. 61/880,263, filed on Sep. 20, 2013.

(51) Int. Cl.
*H04N 5/455* (2006.01)
*H04N 9/66* (2006.01)
*H01L 25/00* (2006.01)

(52) U.S. Cl.
CPC .............. *H04N 5/455* (2013.01); *H01L 25/00* (2013.01); *H04N 9/66* (2013.01); *H01L 2224/05554* (2013.01); *H01L 2224/48227* (2013.01); *H01L 2224/48464* (2013.01); *H01L 2224/49113* (2013.01)

(58) Field of Classification Search
USPC ......... 348/726, 729, 730, 731, 732, 733, 725, 348/720; 439/44, 493, 541.5, 581, 607.07, 439/607.09, 607.11, 607.13, 620.06, 439/620.12, 620.15, 620.2, 620.22, 620.25; 375/235, 316

See application file for complete search history.

(56) References Cited

U.S. PATENT DOCUMENTS

| | | | | |
|---|---|---|---|---|
| 4,897,624 | A * | 1/1990 | Wignot et al. | 334/80 |
| 5,570,137 | A * | 10/1996 | Goeckler | 348/726 |
| 5,589,711 | A * | 12/1996 | Sano et al. | 257/718 |
| 5,721,452 | A | 2/1998 | Fogal et al. | |
| 5,754,252 | A | 5/1998 | Kuhn et al. | |
| 6,026,221 | A * | 2/2000 | Ellison et al. | 700/121 |
| 6,128,043 | A * | 10/2000 | Tulder | 348/555 |
| 6,249,052 | B1 * | 6/2001 | Lin | 257/737 |
| 6,265,936 | B1 * | 7/2001 | Heigl et al. | 330/51 |
| 6,542,203 | B1 * | 4/2003 | Shadwell et al. | 348/726 |
| 6,563,205 | B1 | 5/2003 | Fogal et al. | |
| 6,621,155 | B1 | 9/2003 | Perino et al. | |
| 6,885,093 | B2 | 4/2005 | Lo et al. | |

(Continued)

OTHER PUBLICATIONS

Search Report, GB1407976.8, Oct. 24, 2014, 2 pgs.

*Primary Examiner* — Jefferey Harold
*Assistant Examiner* — Mustafizur Rahman
(74) *Attorney, Agent, or Firm* — Egan, Peterman & Enders LLP.

(57) ABSTRACT

Systems and methods are disclosed for MCM (multiple chip module) packages having multiple stacked demodulator dies that share one or more MCM pins. The shared pins can include clock generation pins, clock input/output pins, receive signal path input pins, voltage supply pins, ground supply pins, and/or any other desired pins. In addition to reducing footprint sizes for printed circuit board (PCB) applications, the multi-demodulator MCM package embodiments described herein also allow for improved routing of connection traces on PCBs.

20 Claims, 7 Drawing Sheets

(56) References Cited

U.S. PATENT DOCUMENTS

| | | |
|---|---|---|
| 7,098,073 B1 | 8/2006 | Mangrum |
| 7,106,388 B2 * | 9/2006 | Vorenkamp et al. ......... 348/726 |
| 7,123,309 B2 | 10/2006 | Yoda |
| 7,199,458 B2 | 4/2007 | Lee |
| 7,245,884 B2 | 7/2007 | Oida et al. |
| 7,358,616 B2 | 4/2008 | Alam et al. |
| 7,725,095 B2 | 5/2010 | Tey et al. |
| 7,727,806 B2 | 6/2010 | Uhland et al. |
| 7,781,878 B2 | 8/2010 | Chen et al. |
| 7,865,165 B2 | 1/2011 | Robinson et al. |
| 7,892,858 B2 | 2/2011 | Liu et al. |
| 7,999,378 B2 | 8/2011 | Mess et al. |
| 8,076,763 B2 | 12/2011 | Thoonen |
| 8,237,869 B2 | 8/2012 | Blouin et al. |
| 8,470,640 B2 | 6/2013 | Takiar et al. |
| 8,502,368 B2 | 8/2013 | Gillingham |
| 8,759,954 B2 | 6/2014 | Do et al. |
| 2004/0001676 A1 * | 1/2004 | Colgan et al. ................... 385/92 |
| 2005/0101274 A1 * | 5/2005 | Toh et al. ................... 455/180.1 |
| 2005/0265486 A1 * | 12/2005 | Crawley ........................ 375/326 |
| 2005/0280742 A1 * | 12/2005 | Jaffe ............................. 348/726 |
| 2006/0158568 A1 * | 7/2006 | Kaylani et al. ................ 348/725 |
| 2007/0018771 A1 * | 1/2007 | Lim et al. ..................... 336/232 |
| 2007/0047870 A1 | 3/2007 | Jeong et al. |
| 2009/0213275 A1 * | 8/2009 | Trager ........................ 348/729 |
| 2010/0110305 A1 * | 5/2010 | Chou et al. ................... 348/726 |
| 2013/0021760 A1 | 1/2013 | Kim et al. |

* cited by examiner

MULTI-CHIP MODULES HAVING STACKED TELEVISION DEMODULATORS

RELATED APPLICATIONS

This application claims priority to the following provisional application: U.S. Provisional Patent Application Ser. No. 61/880,263, filed Sep. 20, 2013, and entitled "MULTI-CHIP MODULES HAVING STACKED TELEVISION DEMODULATORS," which is hereby incorporated by reference in its entirety.

TECHNICAL FIELD

The disclosed embodiments relate to demodulators for television broadcasts, including satellite, cable, and/or terrestrial television broadcasts.

BACKGROUND

There are television applications that require multiple simultaneous channel reception and demodulation of television broadcasts. FIG. 1 (Prior Art) is a block diagram of an embodiment 100 that includes multiple demodulator integrated circuits 116 and 118 for a television receiver system. For the embodiment depicted, a printed circuit board (PCB) 102 includes two satellite television tuner integrated circuits (ICs) 106 and 108 that are configured to receive input radio frequency (RF) signals 104 for satellite broadcast. The PCB 102 also includes two television tuner ICs 112 and 114 that are configured to receive input RF signals 110 for terrestrial or cable television broadcasts. Tuned broadcast channel output signals are routed from each of the ICs 106, 108, 112, and 114 to each of the demodulator ICs 116 and 118, which are configured to demodulate satellite, cable, and/or terrestrial broadcast signals depending upon control signals 122 received from a host processor 120. The demodulators ICs 116/118 are configured to output demodulated signals, such as MPEG (Motion Picture Experts Group) transport streams, to the host processor 120.

SUMMARY

Systems and methods are disclosed for MCM (multiple chip module) packages having multiple stacked demodulator dies that share one or more MCM pins. The shared pins can include clock generation pins, clock input/output pins, receive signal path input pins, voltage supply pins, ground supply pins, and/or any other desired pins. In addition to reducing footprint sizes for printed circuit board (PCB) applications, the multi-demodulator MCM package embodiments described herein also allow for improved routing of connection traces on PCBs. Other features and variations can be implemented, if desired, and related systems and methods can be utilized, as well.

In one embodiment, a multi-chip module (MCM) package is disclosed that has multiple television demodulator dies and includes a plurality of pins where the pins include a plurality of input pins configured to receive two or more tuned broadcast channels associated with at least one of satellite television broadcasts, a plurality of input pins configured to receive two or more tuned broadcast channels associated with terrestrial or cable television broadcasts, and a plurality of output pins configured to provide two or more demodulated television signals. The MCM packet further includes at least two stacked demodulator dies coupled to the plurality of pins where each die has at least one pad connected to a shared pin for the MCM package and where each die is configured to provide at least one of the demodulated television signals. And the MCM package has a top surface area of about 64 square millimeters or less.

In other embodiments, the MCM package includes 68 pins or less. Further, a top surface of the MCM package can be a square shape and have edges that are 8 millimeters or less in length. In still other embodiments, the MCM package includes 48 pins or less. Further, the top surface of the MCM package can be a square shape and have edges that are 7 millimeters or less in length. Still further, the pin pitch for the plurality of pins can be about 0.5 millimeters or less.

In further embodiments, each demodulator die has an input pad coupled to a shared pin that is configured to be coupled to a crystal. Still further, each demodulator die can further include oscillator circuitry having an input coupled to a first crystal pad and an output coupled to a second crystal pad for that demodulator die and can include a buffer having an input coupled to the first crystal pad for that demodulator die where the first crystal pad for each demodulator die is coupled to the shared pin for the MCM package and where the second crystal pad for only one of the demodulator dies is coupled to a non-shared pin for the MCM package that is configured to be coupled to the crystal.

In still further embodiments, each demodulator die can include a circuit block coupled to a pad and configured to operate in a plurality of modes of operation, and the these pads for the demodulator dies can be coupled to a shared pin. In addition, each circuit block can include an input buffer and an output buffer coupled to the pad. Further, one of the plurality of modes of operation can be an input mode of operation where the output buffers are disabled and where the input buffers are enabled. Still further, one of the plurality of modes of operation can be an output mode of operation where the input buffers are disabled, where one of the output buffers is enabled, and where the other output buffers are disabled for the output mode of operation. Also, one of the plurality of modes of operation can be a master/slave mode of operation where an output buffer on one of the demodulator dies is enabled to provide a master clock signal, where the input buffers on the other demodulator dies are enabled to receive the master clock signal, and where the output buffers on the other demodulator dies are disabled for the master/slave mode of operation.

In one other embodiment, a printed circuit board (PCB) system is disclosed that includes a printed circuit board, a plurality of television tuners coupled to the printed circuit board where the tuners including at least two satellite television tuners and at least two terrestrial or cable television tuners, a multi-chip module (MCM) package coupled to the printed circuit board including a plurality of pins and at least two stacked demodulator dies, and a plurality of connection traces on the printed circuit board between the plurality of television tuners and the MCM package. The plurality of pins for the MCM package include a plurality of input pins coupled to the satellite television tuners, a plurality of input pins coupled to the terrestrial or cable television tuners, and a plurality of output pins configured to output two or more demodulated television signals. The stacked demodulator dies are coupled to the plurality of pins, and each die has at least one pad connected to a shared pin for the MCM package. Each die is also configured to provide at least one of the demodulated television signals, and the MCM package has a top surface area of about 64 square millimeters or less.

In other embodiments, the connection traces do not overlap, and at least one or more wire bond connections within the MCM package between pads for the MCM package and pads for the demodulator dies overlap each other. In further embodiments, the MCM package includes 68 pins or less. Further, a top surface of the MCM package can be a square shape and have edges that are 8 millimeters or less in length. In still other embodiments, the MCM package includes 48 pins or less. Further, the top surface of the MCM package can be a square shape and has edges that are 7 millimeters or less in length. Still further, the pin pitch for the plurality of pins can be about 0.5 millimeters or less.

DESCRIPTION OF THE DRAWINGS

It is noted that the appended drawings illustrate only exemplary embodiments and are, therefore, not to be considered limiting of its scope, for the embodiments may admit to other equally effective embodiments.

DETAILED DESCRIPTION

Systems and methods are disclosed for MCM (multiple chip module) packages having multiple stacked demodulator dies that share one or more MCM pins. The shared pins can include clock generation pins, clock input/output pins, receive signal path input pins, voltage supply pins, ground supply pins, and/or any other desired pins. In addition to reducing footprint sizes for printed circuit board (PCB) applications, the multi-demodulator MCM package embodiments described herein also allow for improved routing of connection traces on PCBs. Other features and variations can be implemented, if desired, and related systems and methods can be utilized, as well.

For applications requiring multiple demodulated television broadcast channels, the embodiments disclosed herein provide MCM packages having multiple stacked demodulator dies that share one or more pins within the MCM package. As such, unlike prior solutions, the disclosed embodiments do not require the size of the PCB (Printed Circuit Board) system to grow linearly with the number of demodulated channels required for the television application.

Figure 2:
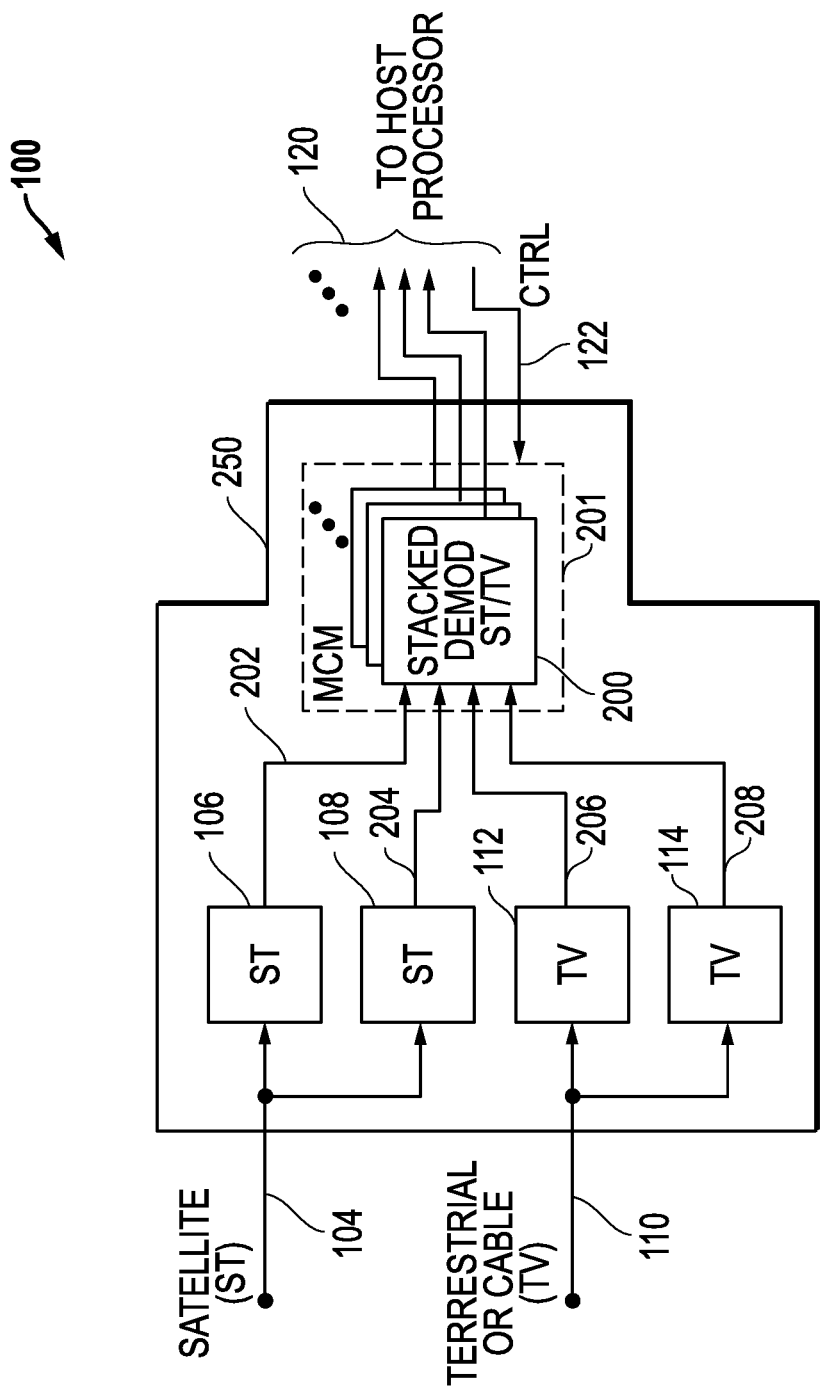
FIG. 2 is a block diagram of an embodiment that includes multiple stacked demodulator dies within a multiple chip module (MCM) package for a television receiver system.

FIG. 2 is a block diagram of an embodiment 200 that includes multiple stacked demodulator dies 200 for a television receiver system. For the embodiment depicted, a printed circuit board (PCB) 250 includes two satellite television tuner integrated circuits (ICs) 106 and 108 that receive input radio frequency (RF) signals 104 for satellite television broadcasts. The PCB 250 also includes two television tuner ICs 112 and 114 that receive input RF signals 110 for terrestrial and/or cable television broadcasts. Tuned output signals 202, 204, 206, and 208 are routed from each of the ICs 106, 108, 112, and 114 to the N different stacked demodulator dies 200. Each of the N stacked demodulator dies 200 are configured to demodulate satellite, cable, and/or terrestrial broadcast signals depending upon control signals 122 received from a host processor 120. In addition, the N stacked demodulator dies 200 can be implemented as semiconductor dies that have circuitry configured to provide demodulation of television broadcast channels and that are stacked within a multi-chip module (MCM) package 201 as described in more detail herein. The demodulator dies output demodulated signals, such as MPEG (Motion Picture Experts Group) transport streams, to the host processor 120. It is noted that the demodulator dies 200 are assumed herein to be duplicate dies having the same input/output pads and related functionality; however, demodulator dies with different input/output pads and related functionality could also be used and stacked within the MCM package 201, if desired. It is also noted that while a single-sided PCB configuration is shown, a dual-sided PCB configuration could also be utilized where devices are mounted on both sides of the PCB with related connection traces.

Figure 1:
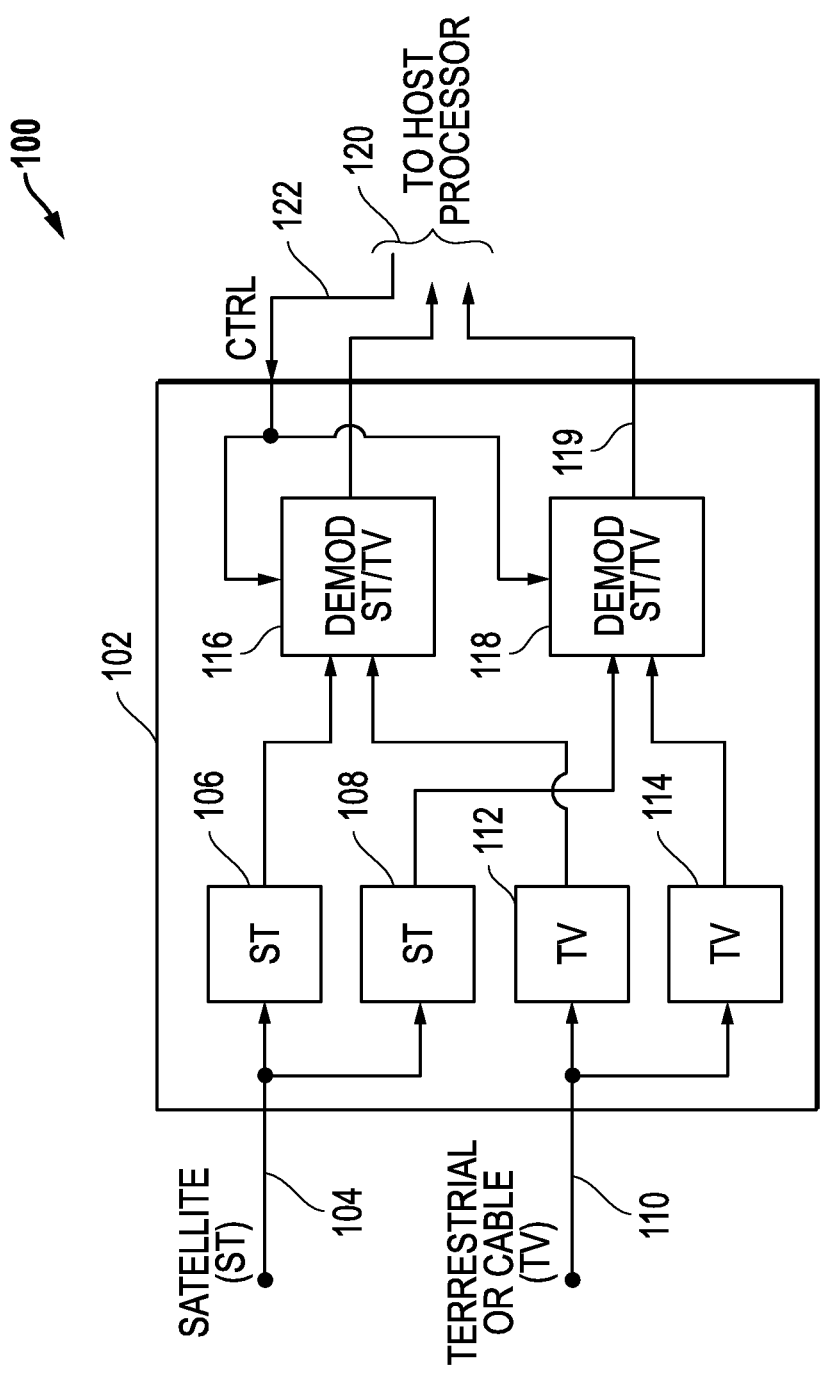
FIG. 1 (Prior Art) is a block diagram of an embodiment that includes multiple demodulator integrated circuits for a television receiver system.

Advantageously, the stacked demodulator dies 200 allow for reduction in pin counts and reduction in the space on the PCB 250 that would otherwise be required for multiple demodulator ICs as shown with respect to embodiment 100 of FIG. 1 (Prior Art). In particular, the stacked demodulator dies 200 and MCM package 201 allow for a significant amount of pin sharing that reduces the total number of pins and thereby reduces the required package size. For example, the MCM package 201 can be a 68-pin package having a top surface package size of about 64 square millimeters (mm) (e.g., 8 mm×8 mm) with a 0.4 mm pin pitch. The MCM package 201 can also be a 48-pin package having a top surface package size of about 49 square millimeters (e.g., 7 mm×7 mm) with a 0.5 mm pin pitch. Further, a smaller pin pitch, such as 0.35 mm, could also be utilized to add additional pins without adding additional size. For example, a pin pitch of about 0.35 mm would allow for about 76 pins in an 8 mm×8 mm package size, and a pin pitch of about 0.4 mm would allow for about 56 pins in an 7 mm×7 mm package size. Another approach to add further pins to the MCM package 201 is to use corner pins. The use of corner pins will as an example increase the number of pins on a 8 mm×8 mm package with 0.4 pitch from 68 to 72 pins and increase the number of pins on an 7 mm×7 mm package with 0.5 pitch from 48 to 52 pins. Further, as described herein, the MCM package 201 can provide this small PCB footprint with about 68 pins or fewer while still being configured to have at least two satellite television tuner inputs, at least two terrestrial or cable television tuner inputs, and at least two demodulated channel outputs. Each of the demodulated channel outputs can be, for example, a parallel or serial digital output configured to provide a demodulated MPEG transport stream associated with the tuned input broadcast channel. Other variations could also be implemented, as desired, while still taking advantage of a MCM package having multiple stacked demodulator dies that share one or more pins for the MCM package to reduce the required PCM footprint for multiple demodulators, as described herein.

With respect to the stacked demodulators within the MCM package, the output pads for each of the demodulator dies can share output pads and related pins for the MCM package, can have different output pads and related pins for the MCM package, and/or not be connected to output pins for the MCM package depending upon the requirements and needs of the particular television application into which the MCM package will be put into use.

Figure 3:
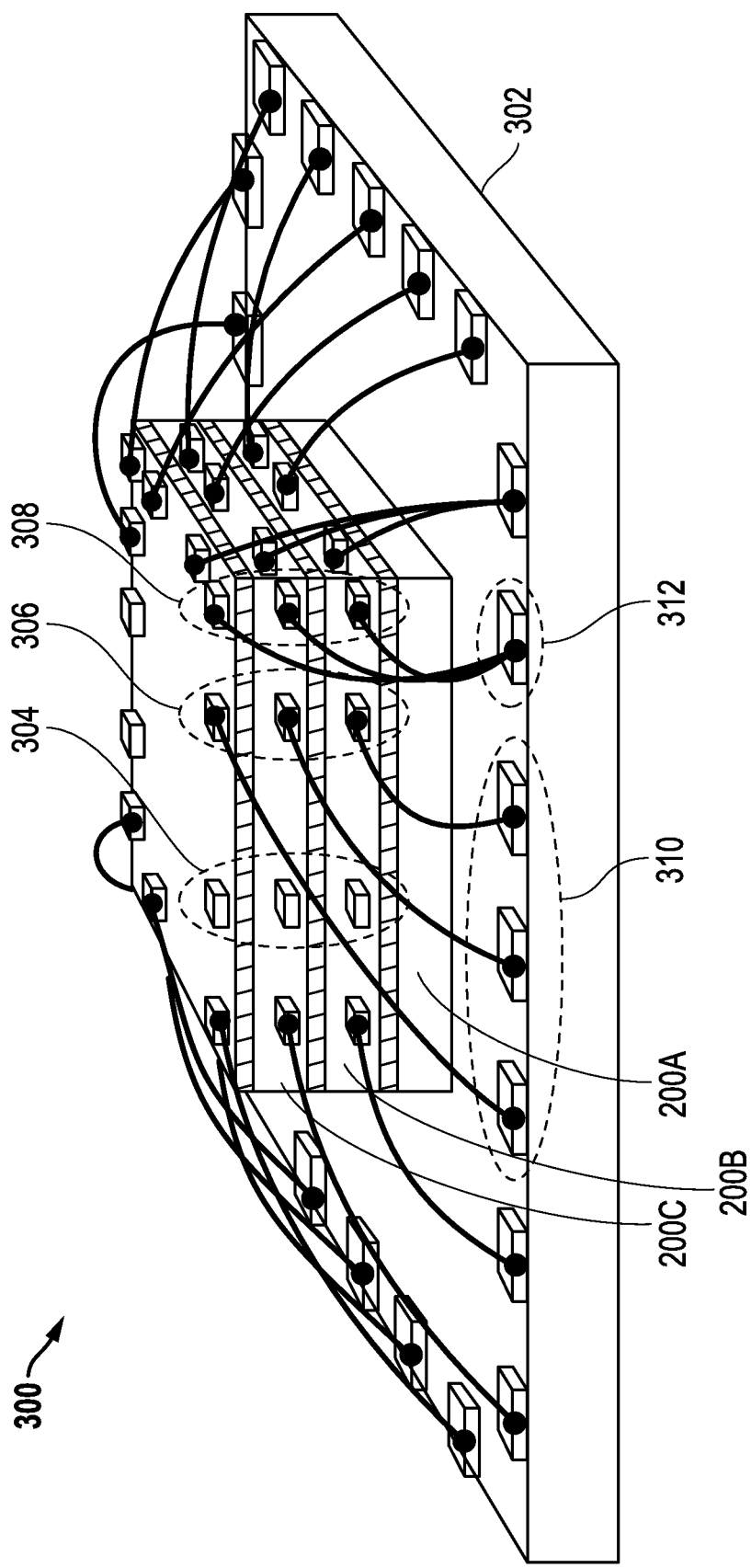
FIG. 3 is a perspective diagram of an embodiment for shared multi-chip module (MCM) pad connections to stacked demodulator dies.

FIG. 3 is a perspective diagram of an embodiment 300 for shared MCM pad connections to stacked demodulator dies. For the embodiment depicted, three demodulator dies 200A, 200B, and 200C are stacked on a lead frame 302. The resulting assembly can be packaged together in a single integrated circuit package to form a multi-chip module (MCM) package. As depicted, selected pads 308 for the different demodulator dies 200A, 200B, and 200C can have bond wire connections to a common shared pad 312 on the lead frame 302. Selected other pads 306 for the different demodulator dies 200A, 200B, and 200C can have bond wire connections to separate pads 310 on the lead frame 302. Certain additional pads 304 can be left unconnected. Connection decisions can also be made for the other pads for the demodulator dies 200A, 200B, and 200C. To complete the MCM package, the lead frame pads are then bonded out to pins for the final MCM package. These MCM pins provide external connections to the tuner ICs 106, 108, 112, and 114 in FIG. 2, as well as to the host processor 120 and other desired external connections, such as power supply voltages and ground connections. It is again noted that the demodulator dies 200A, 200B, and 200C are assumed to be duplicates of each other so that their input/output pads and related functionality are the same, although demodulator dies having different designs and input/output pads could also be utilized.

To reduce MCM package pin count and related package size, it is desirable to increase the number of MCM pads and related pins that are shared by the input/output pads for the stacked demodulator dies and to decrease the number of input/output pads for the stacked demodulator dies that use different MCM pads and related pins. As one example, a decision concerning the pads that can share an output pin and pads that need separate pins for the demodulator dies could be made by first grouping the different pads with respect to their primary and secondary functions. Primary functions could be, for example, power supply input, ground input, analog signal input, digital signal input, analog signal output, digital signal output, clock input, clock output, clock generation (e.g., oscillator), and/or other primary functions. Secondary functions could be related to digital circuit production tests (e.g., test scan input, test scan output, test scan configuration) and/or other secondary functions. The primary and secondary function for the input/output pads for the demodulator dies can be considered simultaneously to determine which MCM output pads/pins can be shared.

Figure 4:
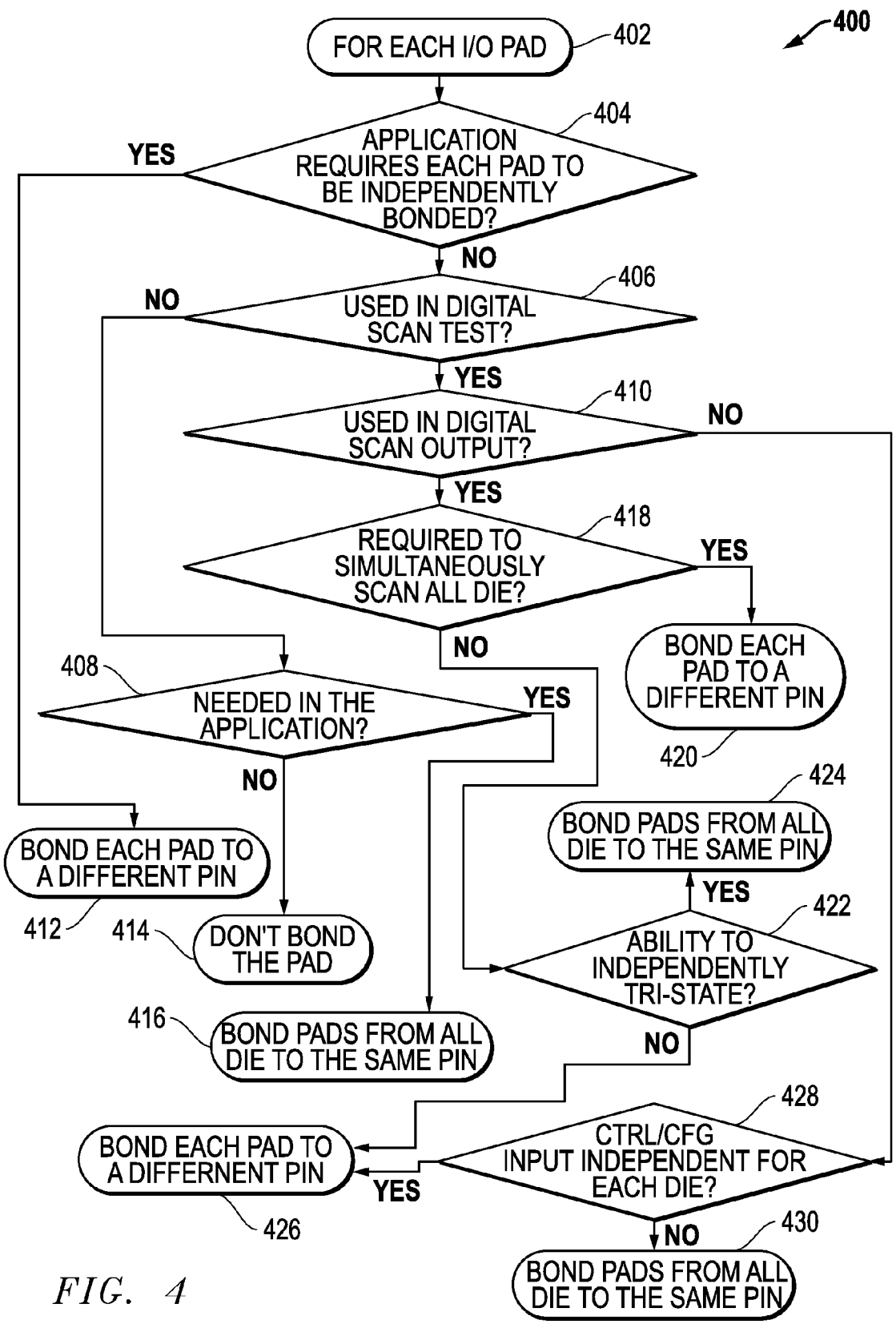
FIG. 4 is a process flow diagram of an embodiment for selecting pads on different demodulator dies that will share MCM pins and for selecting pads on different demodulator dies that will be connected to different MCM pins.

FIG. 4 is a process flow diagram of an embodiment 400 for selecting pads on different demodulator dies that will share MCM pins and for selecting pads on different demodulator dies that will be connected to different MCM pins. The process starts with block 402 for each input/output (I/O) pad for the demodulator dies that will be stacked with the MCM package. In block 404, a determination is made whether the ultimate application for the MCM demodulator package will require each pad to be independently bonded. If "YES," then flow passes to block 412 where each pad is bonded to a different pin. If "NO," then flow passes to block 406 where a determination is made whether or not the pad is used for a digital scan test. If the determination in block 406 is "NO," then flow passes to determination block 408. In block 408, a determination is made whether or not the I/O pad is needed for the ultimate application. If "NO," then flow passes to block 414 where a decision is made not to bond the pad to on an output pin for the MCM package. If "YES," then flow passes to block 416 where a decision is made to bond pads from all die to the same output pin for the MCM package.

If the determination in block 406 is "YES," then flow passes to block 410 where a determination is made concerning whether or not the I/O pad is used for a digital scan output. If "YES," then flow passes to block 418 where a determination is made whether each die is needed to be simultaneously scanned. If "YES," then flow passes to block 420 where a decision is made to bond each pad to a different MCM pin. If "NO," then flow passes to block 422 where a determination is made whether the pads for the different dies are able to be independently tri-stated. If "YES," then flow passes to block 424 where a decision is made to bond pads from all die to the same MCM pin. If "NO," then flow passes to block 426 where each pad is bonded to a different MCM pin. If the decision in block 410 is "NO," then flow passes to block 428 where a determination is made whether a control or configuration input is independent for each die. If "NO," then flow passes to block 430 where pads from all of the die are bonded to the same MCM pin. If "YES," then flow passes to block 426 where each pad is bonded to a different MCM pin.

As described with respect to the example embodiment 400, the television application requirements can be considered as the first factor to take in to account when determining whether or not pads for the demodulator dies can be shared. As an example, if two input signals are needed to be simultaneously demodulated, then two demodulator die with unshared tune signal inputs would need to be utilized. However, the ground and supply pads for these demodulator dies could share the same pin as long as the maximum allowed pin current was not exceeded. Once all of the pins needed in the application are identified, one further limitation to sharing MCM pads/pins is the utilization of demodulator pads for digital scan test inputs or outputs, as these pads would need to be accessed during production test to allow for full test coverage of the demodulator dies. In terms of execution of the scan test at production, whether or not scan tests need to be run simultaneously on each of the demodulator dies will further determine whether or not the scan output pads can be shared or at least partially shared between several demodulator dies. Other considerations could also be utilized, as desired, in determining which pads for the demodulator dies can share pads/pins for the multi-demodulator MCM package.

It is noted that some types of pads for the demodulator dies may have a primary and/or secondary function for which circuit configurations can be used to allow for sharing of MCM pads/pins while still achieving the intended functionality. Examples of such primary and/or secondary functions include the clock generation pads (e.g., oscillator inputs) as described further with respect to FIG. 5 below, clock input/output pads as described further with respect to FIGS. 6A-C below, and/or other primary and/or secondary functions.

Figure 5:
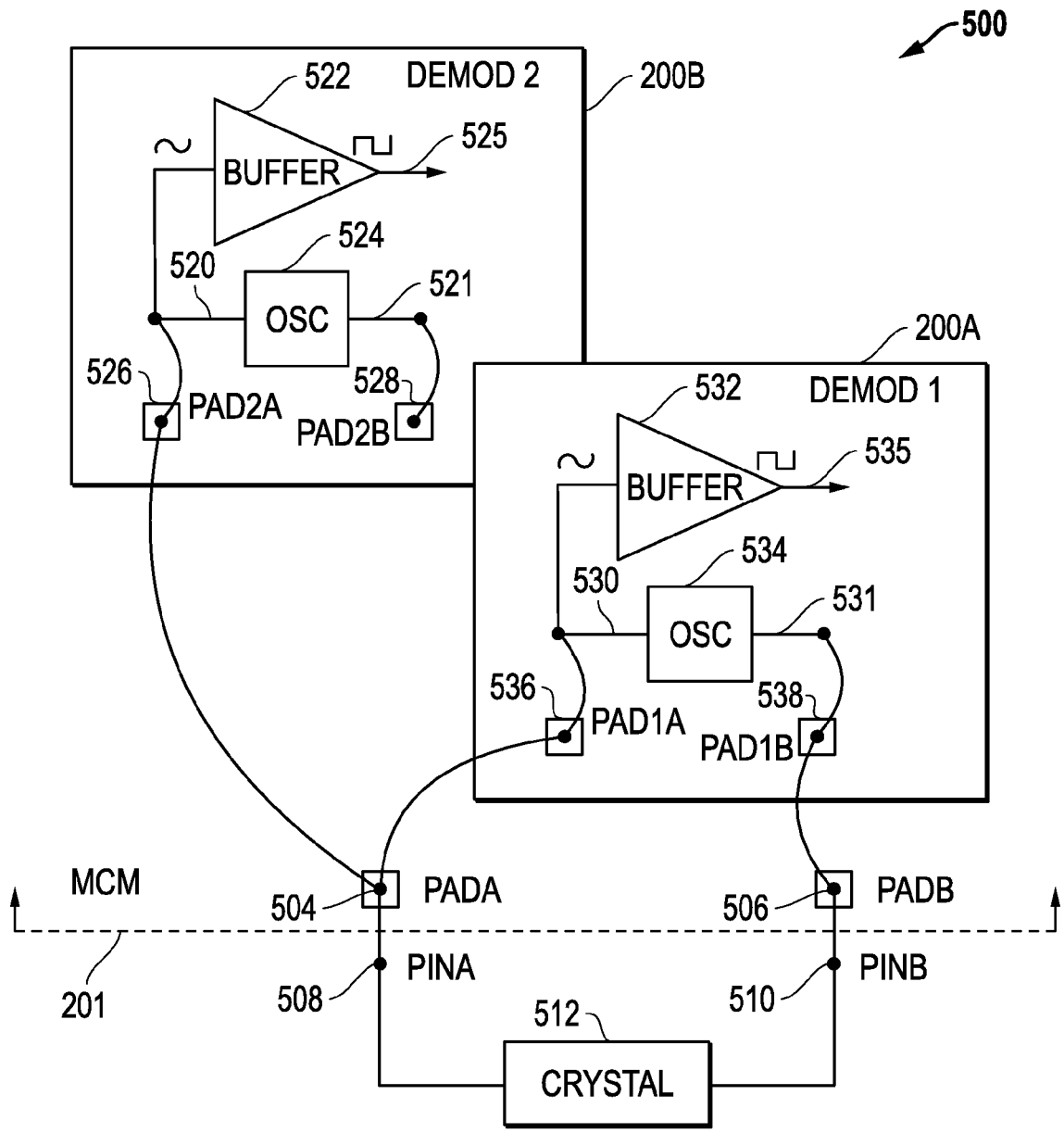
FIG. 5 is a block diagram of an embodiment for an MCM package including two demodulator dies that share MCM pins configured to be connected to a common crystal.

FIG. 5 is a block diagram of an embodiment 500 for an MCM package 201 including two demodulator dies 200A and 200B. The first demodulator 200A includes oscillator circuitry 534 and a squaring buffer 532 that operate to provide an internal square-wave oscillation signal 535 to other internal circuitry. The input 530 to the oscillator circuitry 534 is coupled to a first pad (PAD1A) 536, and the output 531 of the oscillator circuitry 534 is coupled to a second pad (PAD1B)

538. Similarly, the second demodulator 200B includes oscillator circuitry 524 and a squaring buffer 522 that operate to provide an internal square-wave oscillation signal 535 to other internal circuitry. The input 520 to the oscillator circuitry 524 is coupled to a first pad (PAD2A) 526, and the output 521 of the oscillator circuitry 524 is coupled to a second pad (PAD2B) 528. For the example embodiment 500 depicted, the oscillator circuitry 534 for first demodulator 200A is selected and configured to drive an oscillation signal based upon common crystal 512. As such, the first pad 536 for the first demodulator 200A is wire bonded to pad 504 (PADA) for the MCM package 201, and the second pad 538 for the first demodulator 200A is wire bonded to the pad 506 (PADB) for the MCM package 201. The pads 504 and 506 are connected to output pins (PINA, PINB) 508 and 510 for the MCM package 201, which will in turn be coupled to the crystal 512. With respect to the second demodulator die 200B, the second pad 526 is connected to pad 504 to receive an the output oscillation signal waveform driven by the oscillator circuitry 534 for the first demodulator 200A.

Thus, as shown with respect to the example embodiment 500, a single pair of input pads 504/506 and related pins 508/510 for the MCM package 201 can be used to provide connections to a single crystal 512 rather than having multiple crystals and related connections to the demodulator dies. One oscillator circuitry 534 is activated to drive an oscillation signal based upon the crystal 512, while the other oscillator circuitry 524 is deactivated to reduce power consumption. Each of the squaring buffers 522 and 532 can then be activated to allow the oscillation signal to be squared and propagated to the internal circuitry for all of the demodulator dies 200A/200B. All of the "A" pads 526/536 for the demodulator dies 200A/200B can be bonded to the same pad/pin 504/508 for the crystal 512, while only one "B" pad 538 for the demodulator dies 200A/200B is bonded to the second input pad/pin 506/510 for the oscillator 512. It is noted that because only one bond wire is connected to the pad/pin 506/510 and multiple bond wires are connected to the other pad/pin 505/508, adjustments can be made to balance the load capacitance on the input pins 508/510 so that the waveform amplitudes for these inputs pins are balanced.

With respect to embodiment 500 of FIG. 5, it is also noted that the pin 508 could be utilized as an external clock input for the demodulator dies 200A/200B. For example, the crystal 512 can be removed and the oscillator circuitry 524/534 on both demodulator dies 200A/200B can be disabled. As such, an external clock input applied to pin 508 can be used as an input clock to each of the squaring buffers 522/532 for the demodulator dies 200A/200B.

As a further example of shared pins, it is noted that clock input/output (I/O) pads for multiple demodulator dies can be tied together to shared pads/pins for the MCM package and can be utilized together in different programmable modes of operation. For a common input mode as described further respect to FIG. 6A below, the demodulator pads can be used as clock input pads that receive the same clock signal, similar to the example above for an external clock configuration for the crystal input pins. For an output mode as described further with respect to FIG. 6B below, only one pad driver is active and is used to drive the output pad/pin for the MCM package while the other output drivers are disabled. Further, for a master/slave mode as described further with respect to FIG. 6C below, the pad of one of the demodulator dies is used to drive the clock input for the remaining demodulator dies, which are configured to receive the clock signal as an input.

Similar programmable mode strategies could also be applied to other input/output pads and related circuitry for the demodulator dies, if desired.

Figure 6A:
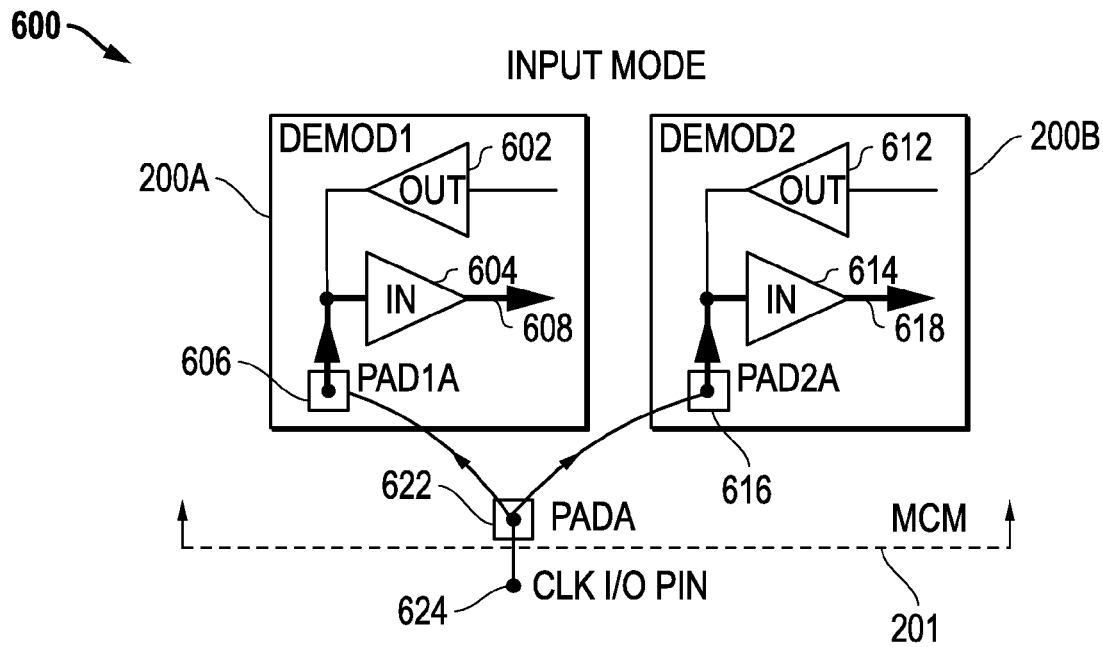
FIG. 6A is a block diagram for an input mode embodiment including two demodulator dies connected to share a clock input/output pin for an MCM package.

Looking now to FIG. 6A, an input mode embodiment 600 is provided that includes a first demodulator die 200A and a second demodulator die 200B connected to share a clock I/O pin 624 for an MCM package 201. The first demodulator die 200A includes an output buffer 602 and an input buffer 604. A pad (PAD1A) 606 for the first demodulator die 200A is connected to the input of the input buffer 604 and the output of the output buffer 602. For the clock input mode of operation, the output buffer 602 is disabled, and the input buffer 604 is enabled to receive a clock signal through pad 606 and to provide a buffered input clock signal 608 to other internal circuitry. Similarly, the second demodulator die 200B includes an output buffer 612 and an input buffer 614. A pad (PAD2A) 616 for the second demodulator die 200B is connected to the input of the input buffer 614 and the output of the output buffer 612. For the clock input mode of operation, the output buffer 612 is disabled, and the input buffer 614 is enabled to receive a clock signal through pad 614 and to provide a buffered input clock signal 618 to other internal circuitry. As stacked die within an MCM package 201, the demodulator dies 200A and 200B can be configured to share a pad (PADA) 622 for the MCM package 201 in order to receive a clock input signal. As such, the pads 606 and 616 are connected to the pad 622 which is in turn connected to the external I/O pin 624 for the MCM package 201. When a clock input signal is provided to pin 624 for the MCM package 201 during an input mode of operation, that clock signal is received by both the input buffer 604 for the first demodulator die 200A and the input buffer 614 for the second demodulator die 200B.

Figure 6B:
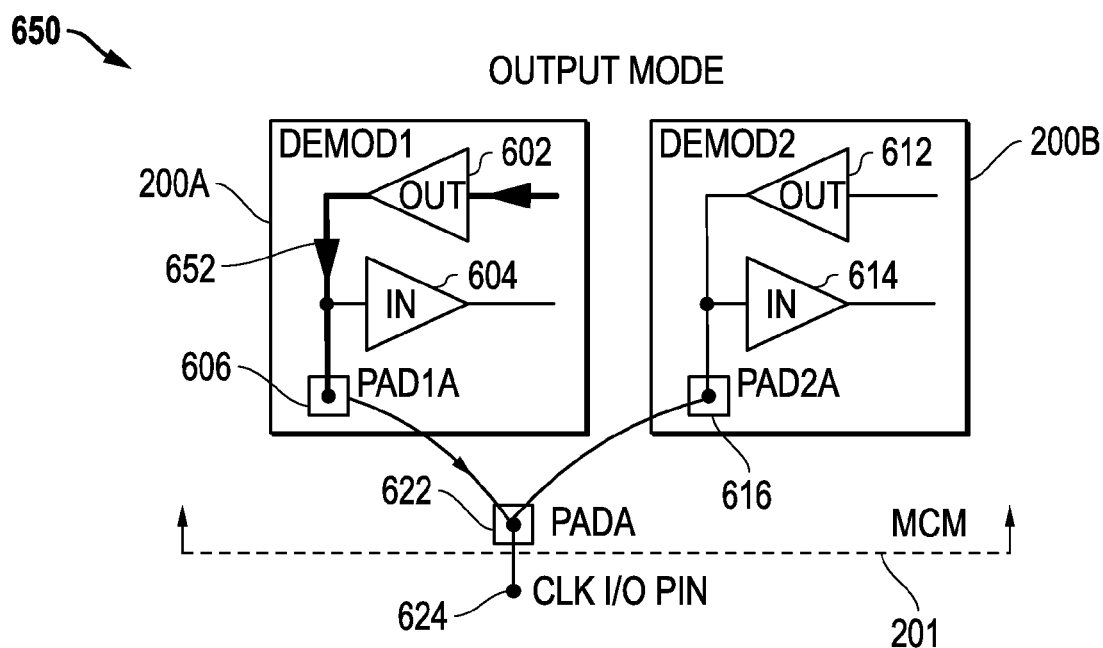
FIG. 6B is a block diagram for an output mode embodiment including two demodulator dies connected to share a clock input/output pin for an MCM package.

FIG. 6B provides an embodiment 650 that includes the first and second demodulator dies 200A and 200B of FIG. 6A in an output mode of operation. As with embodiment 600 of FIG. 6A, the first demodulator 200A includes an output buffer 602 and an input buffer 604, and the pad 606 is connected to the input of the input buffer 604 and the output of the output buffer 602. Similarly, the second demodulator 200B includes an output buffer 612 and an input buffer 614, and the pad 616 is connected to the input of the input buffer 614 and the output of the output buffer 612. For the output mode of operation, one of the demodulator dies is selected to provide the clock output signal. For the embodiment 650 depicted, the first demodulator die 200A has been selected to drive a clock output signal 652 to pad 606 and out of the MCM package 201 through pad 622 and pin 624. For this operation, the input buffer 604 within the first demodulator die 200A is disabled. Further, the input buffer 614 and the output buffer 612 within the second demodulator die 200B are also disabled.

Figure 6C:
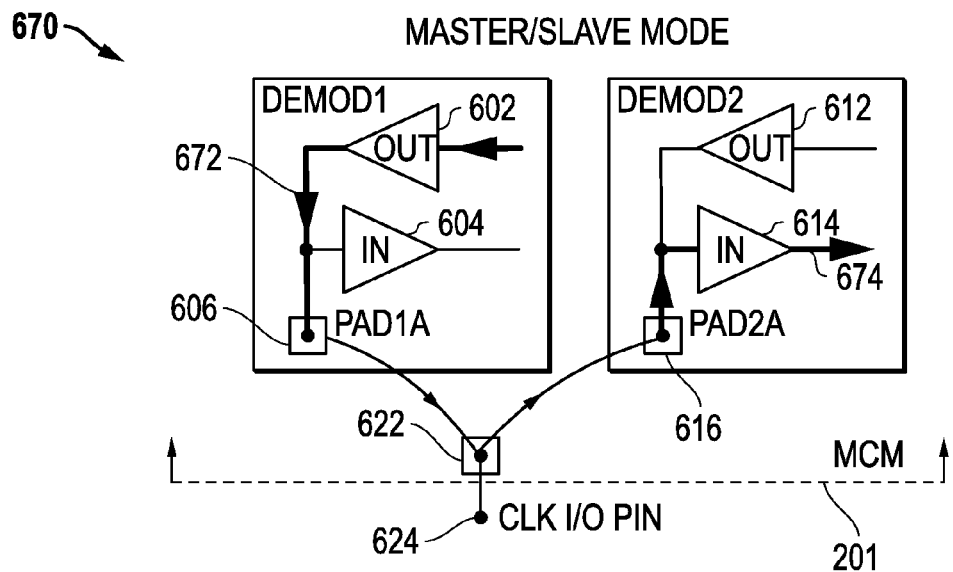
FIG. 6C is a block diagram for a master/slave mode embodiment including two demodulator dies connected to share a clock input/output pin for an MCM package.

FIG. 6C is a further block diagram of an embodiment 670 for demodulator dies 200A and 200B of FIGS. 6A-B in a master/slave clock configuration. As with the embodiments FIGS. 6A-B, the first demodulator die 200A includes an output buffer 602 and an input buffer 604, and the pad 606 is connected to the input of the input buffer 604 and the output of the output buffer 602. Similarly, the second demodulator die 200B includes an output buffer 612 and an input buffer 614, and the pad 616 is connected to the input of the input buffer 614 and the output of the output buffer 612. For the master/slave clock mode of operation, one of the demodulator dies (master) is selected to drive a clock output signal, and the other demodulator die (slave) is selected to receive this signal as a clock input. For the embodiment 670 depicted, the first demodulator die 200A has been selected to provide the master clock. As such, the output buffer 602 on the first demodulator 200A drives an output clock signal 672 to pad 606 and then out to pad 622 for the MCM package 201. The input buffer 614 for the second demodulator die 200B then receives this master clock signal from pad 622 through pad 616. The input buffer 614 then provides a buffered input clock signal 674 to other internal circuitry that is based upon the master clock signal driven by the first demodulator 200A.

The routing of connection traces for PCB systems including a multi-demodulator MCM package can also be efficiently implemented with respect to the embodiments described herein. After determining which pads for the demodulator dies are to be bonded with respect to the stacked die arrangement, further flexibility is provided with respect to how these pads are connected to the pads and related output pins for the MCM package. This flexibility can be used to simply the PCB connection routing required to connect television tuner ICs to the multi-demodulator MCM package. This flexibility allows for signals, such as single-ended and/or differential signals, to be routed in such a way as to provide for a more efficient cancelation of common mode noise and interferers that might otherwise be generated from more complex routing. For example as described further with respect to FIG. 7 below, by alternating MCM pins relevant to the television application instead of alternating MCM pins on a per-demodulator-die basis allows for a cleaner and more direct PCB routing layout to be achieved.

Figure 7:
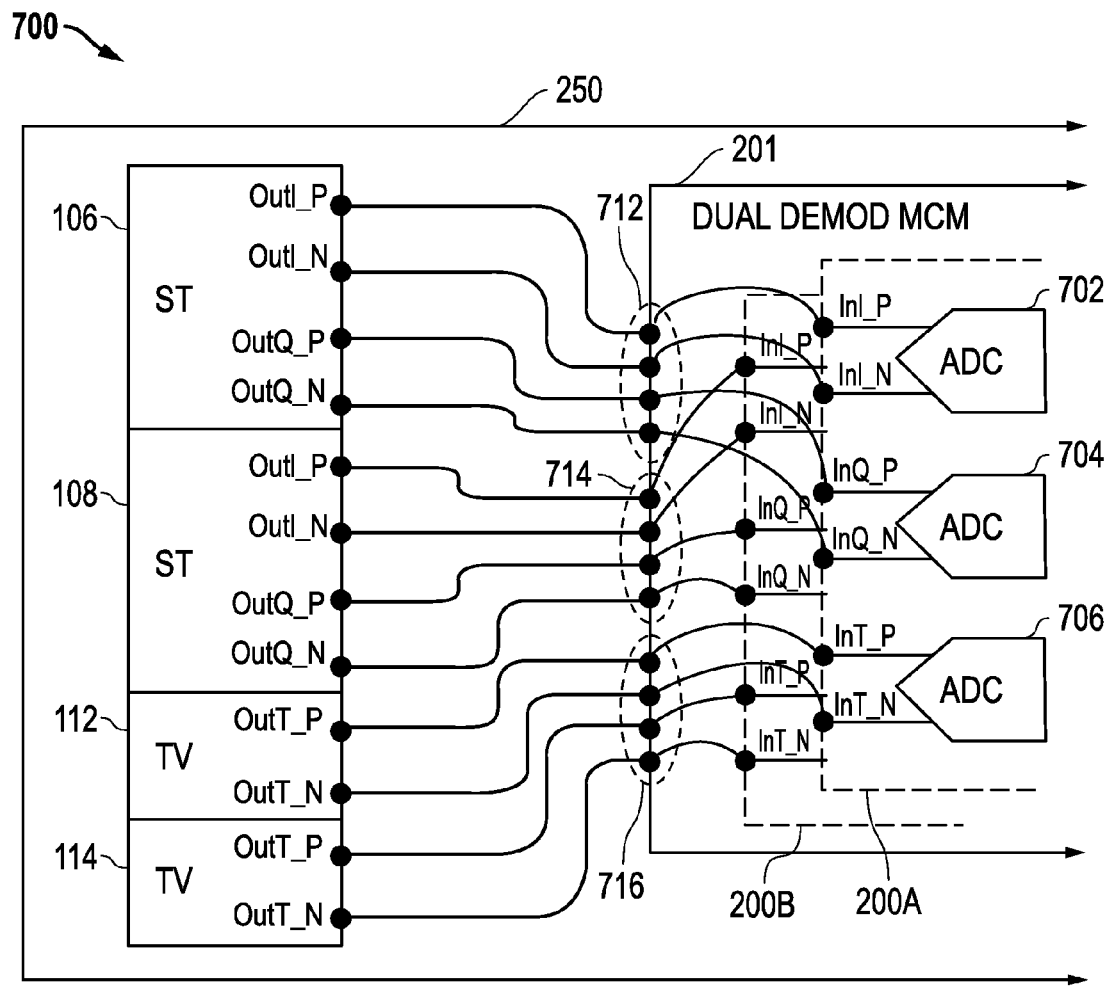
FIG. 7 is an embodiment for an efficient implementation of routing connections from television tuners to a multi-demodulator MCM package on a printed circuit board (PCB).

FIG. 7 is a PCB system routing embodiment 700 for connections to a multi-demodulator MCM package 201 having two demodulator dies 200A and 200B. For the embodiment depicted, the PCB 250 includes two satellite (ST) television tuners 106/108 and two terrestrial/cable (TV) television tuners 112/114. The demodulator MCM package 201 is a dual demodulator including a first demodulator die 200A and a second demodulator die 200B. Multiple analog-to-digital converters (ADCs) and other circuitry are included within each demodulator die 200A/200B to process and demodulate the received signals. As one example, each demodulator die 200A/200B can include an I-channel ADC 702 that is configured to receive a differential real (I) signal from a satellite tuner, a Q-channel ADC 704 that is configured to receive a differential imaginary (Q) signal from a satellite tuner, and a terrestrial/cable ADC 706 configured to receive a differential input signal from a terrestrial/cable television tuner. Each of the satellite tuners 106/108 can be configured to output differential I-channel and Q-channel signals representing a tuned broadcast channel, and each of the terrestrial television tuners 112/114 can be configured to a output differential signal representing a tuned channel. The differential signals are configured to have a positive (P) component and a negative (N) component.

By utilizing an MCM package 201 having multiple demodulator dies 200A/200B and configuring the MCM pins with respect to inputs for the television application, the routing of the connection traces on the PCB 250 can be implemented as clean and non-overlapping connection traces. In particular, the MCM pins are configured with respect to the inputs from the tuners 106/108/112/114 rather than being configured with respect to the internal demodulator dies 200A/200B/200C. As such, the first set of MCM pins 712 are connected to pads for the differential I-channel and Q-channel ADCs 702/704 on the first demodulator die 200A. The second set of MCM pins 714 are connected to pads for the differential I-channel and Q-channel ADCs 702/704 on the second demodulator die 200B. The third set of MCM pins 716 are connected to the differential terrestrial ADCs 706 on both demodulator dies 200A/200B. As shown, the resulting connection traces on the PCB 250 are clean and non-overlapping. This advantageous result can be achieved because the wire bonding of the pads within the MCM package 201 can provide any required overlap so that input signals are applied to the appropriate internal circuitry for the demodulator dies 200A/200B. With respect to embodiment 700, for example, it is seen that the connections between the MCM pads/pins 712/714/716 and the input pads on the demodulator dies 200A/200B for the ADCs 702/704/706 are overlapped as needed so that the connection traces from the tuners 106/108/112/114 to the dual demodulator MCM package 201 can be laid out cleanly with no need for overlapped traces on the PCB 250. In short, the wire bond connections from the pads of the MCM package 201 to the pads for the demodulator dies 200A/200B can provide for any needed overlap so that the input/output signals are connected to the appropriate internal circuitry, such as the ADCs 702/704/706, on each demodulator die 200A/200B. Other pins for the MCM package 201 can be similarly configured to allow for clean and non-overlapping PCB connection traces, as desired.

Further modifications and alternative embodiments will be apparent to those skilled in the art in view of this description. It will be recognized, therefore, that the disclosed embodiments are not limited by these example arrangements. Accordingly, this description is to be construed as illustrative only and is for the purpose of teaching those skilled in the art the manner of carrying out the disclosed embodiments. It is to be understood that the forms of the embodiments shown herein and described are to be taken as the presently preferred embodiments. Various changes may be made in the implementations and architectures. For example, equivalent elements may be substituted for those illustrated and described herein, and certain features of the embodiments may be utilized independently of the use of other features, all as would be apparent to one skilled in the art after having the benefit of this description of the embodiments.

What is claimed is:

1. A multi-chip module (MCM) package having multiple television demodulator dies, comprising:
    a plurality of pins, the pins comprising:
        a plurality of input pins configured to receive two or more tuned broadcast channels associated with at least one of satellite television broadcasts;
        a plurality of input pins configured to receive two or more tuned broadcast channels associated with terrestrial or cable television broadcasts; and
        a plurality of output pins configured to provide two or more demodulated television signals;
    at least two stacked demodulator dies coupled to the plurality of pins, each die having at least one pad connected to a shared pin for the MCM package and each die being configured to provide at least one of the demodulated television signals;
    wherein the MCM package has a top surface area of about 64 square millimeters or less.

2. The MCM package of claim 1, wherein the plurality of pins is 68 pins or less.

3. The MCM package of claim 2, wherein a top surface of the MCM package is a square shape and has edges that are 8 millimeters or less in length.

4. The MCM package of claim 1, wherein the plurality of pins is 48 pins or less.

5. The MCM package of claim 4, wherein a top surface of the MCM package is a square shape and has edges that are 7 millimeters or less in length.

6. The MCM package of claim 1, wherein a pin pitch for the plurality of pins is about 0.5 millimeters or less.

7. The MCM package of claim 1, wherein each demodulator die has an input pad coupled to a shared pin that is configured to be coupled to a crystal.

8. The MCM package of claim 7, wherein each demodulator die comprises oscillator circuitry having an input coupled to a first crystal pad and an output coupled to a second crystal pad for that demodulator die, wherein each demodulator die comprises a buffer having an input coupled to the first crystal pad for that demodulator die, wherein the first crystal pad for each demodulator die is coupled to the shared pin for the MCM package, and wherein the second crystal pad for only one of the demodulator dies is coupled to a non-shared pin for the MCM package that is configured to be coupled to the crystal.

9. The MCM package of claim 1, wherein each demodulator die includes a circuit block coupled to a pad, wherein the pads for the demodulator dies are coupled to a shared pin, and wherein the circuit blocks are configured to operate in a plurality of modes of operation.

10. The MCM package of claim 9, wherein the circuit block comprises an input buffer and an output buffer coupled to the pad.

11. The MCM package of claim 10, wherein one of the plurality of modes of operation comprises an input mode of operation, the output buffers being disabled and the input buffers being enabled for the input mode of operation.

12. The MCM package of claim 10, wherein one of the plurality of modes of operation comprises an output mode of operation, the input buffers being disabled, one of the output buffers being enabled, and the other output buffers being disabled for the output mode of operation.

13. The MCM package of claim 10, wherein one of the plurality of modes of operation comprises a master/slave mode of operation, an output buffer on one of the demodulator dies being enabled to provide a master clock signal, the input buffers on the other demodulator dies being enabled to receive the master clock signal, and the output buffers on the other demodulator dies being disabled for the master/slave mode of operation.

14. A printed circuit board (PCB) system, comprising:
a printed circuit board;
a plurality of television tuners coupled to the printed circuit board, the tuners including at least two satellite television tuners and at least two terrestrial or cable television tuners;
a multi-chip module (MCM) package coupled to the printed circuit board, comprising:
a plurality of pins, the pins comprising:
a plurality of input pins coupled to the satellite television tuners;
a plurality of input pins coupled to the terrestrial or cable television tuners; and
a plurality of output pins configured to output two or more demodulated television signals;
at least two stacked demodulator dies coupled to the plurality of pins, each die having at least one pad connected to a shared pin for the MCM package and each die being configured to provide at least one of the demodulated television signals;
wherein the MCM package has a top surface area of about 64 square millimeters or less; and
a plurality of connection traces on the printed circuit board between the plurality of television tuners and the MCM package.

15. The PCB system of claim 14, wherein the connection traces do not overlap, and wherein at least one or more wire bond connections within the MCM package between pads for the MCM package and pads for the demodulator dies overlap.

16. The PCB system, of claim 14, wherein the plurality of pins is 68 pins or less.

17. The PCB system of claim 16, wherein a top surface of the MCM package is a square shape and has edges that are 8 millimeters or less in length.

18. The PCB system of claim 14, wherein the plurality of pins is 48 pins or less.

19. The PCB system of claim 18, wherein a top surface of the MCM package is a square shape and has edges that are 7 millimeters or less in length.

20. The PCB system of claim 14, wherein a pin pitch for the plurality of pins is about 0.5 millimeters or less.

* * * * *